United States Patent [19]

Patraw

[11] Patent Number: 4,695,870
[45] Date of Patent: Sep. 22, 1987

[54] INVERTED CHIP CARRIER

[75] Inventor: Nils E. Patraw, Redondo Beach, Calif.

[73] Assignee: Hughes Aircraft Company, Los Angeles, Calif.

[21] Appl. No.: 811,207

[22] Filed: Mar. 27, 1986

[51] Int. Cl.[4] .............................................. H01L 23/02
[52] U.S. Cl. ......................................... 357/74; 387/68; 387/56; 387/80; 174/52 FP; 361/380
[58] Field of Search ........................ 357/74, 75, 80, 68, 357/56; 174/52 FP; 361/380

[56] References Cited

FOREIGN PATENT DOCUMENTS 0133125  2/1985  European Pat. Off. .............. 357/74
0166634  1/1986  European Pat. Off. .............. 357/74

Primary Examiner—Andrew J. James
Assistant Examiner—Mark Prenty
Attorney, Agent, or Firm—Ronald L. Taylor; A. W. Karambelas

[57] ABSTRACT

Apparatus is disclosed for providing microelectronic, intra-chip and chip-to-chip interconnections in an ultra-dense integrated circuit configuration. An inverted chip carrier 36 comprises a carrier 35 between an improved interconnection device 37 and a semiconductor chip 12. The carrier 37 includes a mesa portion 52 bearing an array of conductive connectors 50 extending above ledge portions 54. Ledge terminals 56 are connected to the connectors 50 atop the mesa 52 by internal carrier conductors 51 and are connected to chip 12 through short, straight wires 58 that are coupled to chip 12 at conductive pads 60. Carrier 35 and chip 12 together form a sub-assembly 39 which mates with an array of complementary connectors 48 on the lower surface of an improved interconnection device 37. The present invention eliminates undesirable and wasteful looped wirebonds and provides substantial increases in volume available for active circuitry per planar die area.

22 Claims, 3 Drawing Figures

INVERTED CHIP CARRIER

BACKGROUND OF THE INVENTION

Cross Reference to Related Patent Applications

The present patent application is related to two pending patent applications entitled "Compressive Pedestal for Microminiature Connections" (Ser. No. 811,560, Filed: Dec. 20, 1985) and "Chip Interface Mesa" (Ser. No. 811,239, Filed: Dec. 20, 1985), both also invented by Nils E. Patraw and both assigned to the Hughes Aircraft Company.

1. Field of the Invention

The present invention pertains to Ultra-Dense, Extremely Large Scale Integration and wafer scale synthesis of microelectronic components residing on a large number of integrated circuits. The specific focus of the preferred embodiment is the planar and orthogonal space optimization of active microelectronic circuit elements which makes possible multi-chip VHSIC hybrids having extraordinarily high signal processing capabilities and enormous memory capacity.

2. Background Information

Over the past four decades, the electronics industry has witnessed vast improvements in the performance of electronic components. The transition from thermoionic devices to solid state diodes and transistors was the first phase of intense efforts to miniaturize circuitry in order to construct powerful digital computers. The second great phase of innovation involved the consolidation of discrete solid state devices into a compact, unitary circuit which shared a single housing. Before the advent of integrated circuits, components like transistors were individually encapsulated in plastic cases or resided separately in metal cans. These single elements were generally mounted on circuit boards and each had a number of leads connected together by soldered wires. The first generation of integrated circuits combined many discrete active elements together on several alternating layers of metallic and dielectric films which were deposited on an insulating substrate. These early integrated circuits, called thin-film hybrids, were the precursors of current integrated circuits which contain a solitary, but extremely powerful and densely packed, semiconductor chip or die. This semiconductor chip comprises a base or substrate of material, upon which many thin layers are formed that are, in turn, coupled together by tiny, metallic interconnects or vias which pass vertically through the several horizontal layers. A semiconductive material such as silicon, germanium, or gallium arsenide can be chemically altered in order to form carefully selected, minute regions having different electrical properties. These distinct regions are now fabricated with great precision, and each region may measure less than one millionth of an inch. A few regions which exhibit different degrees of electrical conductivity can be grouped together in order to form a device that can help perform a mathematical calculation or store information. These groups of microscopically small regions or zones within one of the many layers of one monolithic chip are the modern analogs to the discretely packaged components which preceded them twenty and thirty years ago.

As each phase of electronic components produced improvements in calculation speed and memory capacity, the packaging of these components became more and more important. Technological advancements that solve problems concerning the fabrication or further miniaturization of semiconductor materials and devices simultaneously create a concomitant packaging problem. As circuit components shrink to increasingly smaller dimensions, the problem of accessing each component grows worse. When integrated circuits become so densely packed that a million of separate active devices occupy a space smaller than the diameter of the eraser on a common pencil, the difficulties involved in exchanging information in the form of electrical signals between that vast network of tiny circuit elements and the outside world become enormous.

Another level of complication is reached when designers attempt to connect many integrated circuits together in a unitary system. Semiconductor chips which are shorter than the width of the eraser at the end of the pencil and less than two one hundreths of an inch thick are manufacturer simultaneously by the hundreds on thin circular wafers of semiconductive material that are typically about four inches wide. Recent attempts to couple all the separate chips on the wafer gave rise to the term wafer scale integration. An electronic device which could incorporate tens, hundreds, or perhaps even thousands or millions of already immensely powerful separate chips, each comprising roughly a million active components, together on one wafer would constitute a tremendous technological leap forward in the electronics arts.

Among the most serious problems encountered in designing and manufacturing integrated circuits and multiple integrated circuit arrays are the deleterious consequences of using fine filaments of wire to connect the miniscule terminals or pads which are the access points to the outside world from the internal circuitry of the integrated circuit. These fragile, very light gauge connecting wires are typically one one-thousanth of an inch in diameter. One common technique for attaching these wires or leads to the conductive external terminals of the chip is thermocompression bonding. This process combines the application of heat and stress on an integrated circuit die. A very small wedge-shaped probe or tool called a bonding wedge must be viewed through a microscope and guided over a wire which is to bonded onto a conductive pad. The pad is usually located at the periphery of the semiconductor chip or die, which is placed on a heating device in order to soften the metallic material comprising the pad. A refinement of the bonding wedge is called a nailhead or ball bonder, in which the pressure bonding tool consists of a glass capillary tube that feeds the wire through its center to the pad. A flame melts the end of the wire that protrudes out of the open end of the capillary tube and forms a ball having a diameter about twice the thickness of the wire. The wire is then retracted in the tube and the ball is held snugly against the orifice while the tube is moved over the pad and impressed upon it with considerable force. The compression deforms the ball into a flattened thermocompression bond shaped like the head of a nail. The tube is then pulled back from the pad, and the flame is employed again to melt the wire which is now attached to a pad on the die. The wires and the contact pads are typically made of gold or aluminum.

Although thermocompression bonding has proven useful over many years of manufacturing, this method suffers from many shortcomings. Aside from the great expense incurred in either bonding wires and pads manually or with the aid of costly automated equipment, any mechanical connection like a pressure bond is susceptible to failure caused by a multitude of environmental factors. Since any fabrication process will be less than perfect, some wirebonds will be faulty after manufacturing. Even if only one percent of the connections are inadequate, the entire electronic system which includes the chip with the bad connection may be rendered completely inoperative as a consequence. Different rates of expansion and contraction of the connected materials due to changes in temperature will tend to destroy bonds over time. The ambient environment may contain compounds which will initiate chemical processes such as oxidation that may corrode and destroy metallic connections. The installation of subcomponents, handling, or vibration encountered during use may detach these wire bridges in time.

In addition to the nettlesome problems of keeping a wire bond intact over the life of an electronic device, this mode of connecting portions of one chip or an array of many chips is beset by problems even if all the bonds are perfectly made and are never broken. The vast number of wire bonds needed to connect large numbers of chips result in an enormous total length of conductive pathways in the system circuit. These conductors consume electrical power since they are resistive components. Increased ambient temperature caused by this thermal heating may impair the operation of the associated integrated circuits. The wires inject unwanted inductance and capacitance into otherwise precisely balanced circuits. Crosstalk between conductors may severely impair the performance of the entire system. Time delays inherent in the long pathways reduce computation capability.

Perhaps the worst problem is the enormous space which is wasted when wires are used to connect together portions of a chip or an array of many chips. Each span of wire that connects two points which reside substantially in the same plane requires a looped, generally parabolic length of bent wire. The amount by which the wire can be bent is limited by the fragility and susceptibility of the wire to fracture. In addition, the size of the wire bonding tool mandates a minimum spacing between contact points which receive thermocompression bonds. These loops of wire impose limits on the horizontal density of the chip deployment, since a minimum space for each loop must be provided between each adjacent chip. Conventional wire bonding techniques impose die interspacing contraints of no less than twice the thickness of the die. If the die is on the order of twenty mils of an inch in height, as much as fifty mils will be wasted in order to provide adequate separation for the making the wire bonds. The pads which receive the wire bonds also consume precious space on the die. Each pad must be large and sturdy enough to tolerate the great pressure transmitted by the wire bond tool. The wire bonds not only consume valuable horizontal surface area on the face of the die, but also take up space above the plane of the die. The looped portions of the connecting wires can extend far above the die face and preclude the stacking of several levels of chip array planes. When connecting wires consume space above or below the active die surface, the vertical or orthogonal space that extends perpendicular to the active circuitry must be reserved for protruding wires. These exposed wires are vulnerable to a host of environmental hazards including physical shock, vibration, and extremes of temperature.

Previous microcircuit connection and wafer scale integration inventions have attempted to solve the depolyment and packaging problems inherent in combining and connecting millions of active circuit components using a variety of approaches. In U.S. Pat. No. 3,811,186, Larnerd et al. describe a method for aligning and supporting microcircuit devices on substrate conductors when the conductors are attached to the substrate. A shaped, flexible, insulative material placed between the devices and their corresponding conductors supports terminals which can be fused together with heat in order to attach conductors after they have been properly aligned.

Beavitt et al. disclose an integrated circuit package including a number of conductors bonded between a cover and a cavity formed within a base that holds a chip in U.S. Pat. No. 3,825,801. This cavity serves as a carrier for the chip, which is held in place between conductive strips of resilient material that are secured between a base and cover of insulating material.

A process for producing sets of small ceramic devices such as leadless inverted chip carriers that have solderable external connections is disclosed by Hargis in U.S. Pat. No. 3,864,810. After firing several layers of ceramic material on a base sheet, Hargis mounts a chip on the ceramic carrier by embedding or encapsulating it in an epoxy resin in order to provide leads for the chip which are more easily connected to external devices than the chip terminals themselves.

In U.S. Pat. No. 3,868,724, Perrino reveals connecting structures for integrated circuit chips which are fabricated by forming many sets of leads on a flexible tape. These leads penetrate through holes formed in the tape and terminate in contacts which are arranged in a pattern that corresponds to a pattern of contacts on an integrated circuit chip. The chips are enclosed by an epoxy encapsulant after they are bonded to the contacts.

Hartleroad et al. explain a method and apparatus for positioning semiconductor flip chips onto one end of a transfer probe which automatically and magnetically aligns the chips and bonds them to an overlying lead frame structure. Their method for placing flip chips into one end of an elongated groove of a positioning apparatus and conveying them on guide rails using a magnetic force to properly locate the chips before bonding is the subject of U.S. Pat. No. 3,937,386.

An electrical package for Large Scale Integrated devices which utilizes solder technology to interconnect a carrier, a circuit transposer and LSI devices is described by Honn et al. in U.S. Pat. No. 4,074,342. The Honn electrical package includes a carrier which has a thermal expansion coefficient similar to semiconductor material, a standard array of terminal pins, and the transposer, which they claim eliminates mechanical stress on solder joints that is caused by dissimilar thermal expansion of the various packaging materials.

Inoue discloses a semiconductor device insulation method in U.S. Pat. No. 4,143,456. This invention employs a protective covering for a semiconductor device which includes a circuit board bearing a conductive pattern and a chip. Inoue fixes his chip with a eutectic or electrically connected adhesive to a die bonded portion of the circuit board pattern with aluminum wire.

U.S. Pat. No. 4,147,889—Andrews et al. describe a thin, dielectric, dish-shaped chip carrier which has flexible mounting flanges having plated or bonded solderable conductive traces and paths. These traces and paths are coupled with plated or bonded heat sinks which are electrically grounded and provide structural integrity.

A flat package for an integrated circuit device that has output pads comprising a supporting member for the integrated circuit device, external output terminals, and array of output conductors, and an electrically insulating encapsulation cover is illustrated in Ugon's U.S. Pat. No. 4,264,917. This invention includes contact islands arranged on a supporting wafer to provide a package for one or more integrated circuit devices having a reduced thickness and surface area.

None of the inventions described above solves the problem of wasted planar and orthogonal space that results from the high portion of chip assemblies that are devoted to chip interconnections such as wirebonds. None of these prior methods or apparatus provides an effective and comprehensive solution which addresses all of the complex aspects of achieving ultra-high density of active semiconductor components. Such a solution to this problem would satisfy a long felt need experience by the semiconductor and intergrated circuit industries for over three decades.

A truly practical and reliable means for producing efficacious intra-chip and chip-to-chip interconnections without squandering a substantial portion of the die's planar and orthogonal space would constitute a major advancement in the microelectronics field. Manufacturers of semiconductor dies could employ such an innovative design to produce integrated circuits capable of processing information at speeds greatly exceeding the current state of the art and capable of storing vast quantities of data far beyond today's most densely packed designs. Such an invention would ideally be suited to operate in cooperation with a wide variety of computing systems and would perform consistently and reliably over a wide range of operating conditions and system applications. Extremely Large Scale Integration microcircuitry would also satisfy the rigorous demands of supercomputers and orbital defense systems. An invention which enables aerospace microelectronic designers to deploy enormously powerful yet extremely compact integrated circuits in orbit for space defense systems would most certainly constitute a major technological advancement in the electronics arts.

SUMMARY OF THE INVENTION

The aim of the present invention is to help accomplish this major technological advancement. The Patraw Inverted Chip Carrier enables designers of integrated circuits to connect the integrated circuits together in order to form unitary, on-wafer chip arrays which have signal processing and memory capacities that dwarf previous previous discretely connected, multiple integrated circuit systems. The present invention extends the current state of the art beyond Very Large Scale Integration (VLSI) capabilities to the higher range of Ultra-Dense, Extremely Large Scale Integration (ELSI) using the wafer scale synthesis techniques described and claimed below.

The inverted chip carrier has a cross-section which resembles a pair of adjoining staircases having a common upper landing. The carrier comprises an upper, mesa portion which extends above a pedestal that includes four peripheral ledge portions. The bottom of this pedestal abuts and carries a semiconductor chip. This semiconductor chip or die has an active circuit surface which faces upward toward the bottom of the inverted chip carrier. The semiconductor chip is electrically accessed through an array of conductive terminals or pads at the edges of the top of the rectangular chip. These chip input/output terminals surround the ledge portions of the carrier and are electrically coupled to the carrier by short, fine wires that are bonded to the pads. Horizontal metal layers extend from inside the carrier out to the pads on the ledges to bring electrical signals to and from the chip into and out of the carrier. Vertical conductive posts within the dielectric carrier are joined to the horizontal layers, and convey the signals up to an array of connectors deployed on the top surface of the mesa. The top of the mesa is the carrier surface that is the farthest away from the chip it carries. The array of connectors which face away from the chip below the carrier mates with an identical array of connectors on the receiving surface of an interconnection device that faces toward the chip. The interconnection device provides links between various components within one chip or provides connections between different chips. By connecting many chips together, many semiconductor dies on a wafer can be combined in order to realize full, wafer-scale reconstruction.

This innovative configuration redirects the wirebonds encountered in prior devices from the perimeter of the chip's active circuitry to a space which lies above the chip's active circuitry. This repositioning of intra-chip and chip-to-chip interconnections to a space which lies within the perimeter of the chip and above the active circuitry of the chip optimizes packaging space for integrated circuit assemblies and enables designers to approach the theorectical density limit for semiconductor devices due to the enormous saving of space which was once wasted by wirebonds between adjacent chips. The present invention reserves all of the planar space of a multi-chip array for active semiconductor circuitry, and banishes inefficient interconnection space to a volume over or orthogonal to the plane of the active circuitry. This important new integrated circuit assembly design not only optimizes packaging criteria, but also permits the stacking of many parallel levels of continguous chips with a minimum of costly inter-chip spacing.

It is, therefore, an object of the present invention to provide apparatus for micro-miniature electronic interconnection which maximizes the density of active, integrated circuit devices in a given volume.

Another object of this invention is to provide a simple and reliable means of connecting circuits within a chip or connecting circuits within many different chips in order to make previously impossible wafer-scale synthesis designs practical and cost-effective.

Still another object of the present invention is to provide a means of connecting large numbers of semiconductor dies using currently commercially available dies and existing packaging technology.

Yet another object of the invention is to provide chip arrays having increased system speeds due to drastic reductions in propagation delay times which results from the great decrease in path length of interconnecting wires.

It is also an object of this invention to provide a chip carrier which enables designers to take advantage of enormous reductions in power consumption, since the elimination of a multitude of long wirebonds dispenses with a substantial source of wasteful, resistive heating.

Another object of the present invention is to provide a method of installing many chips together on a pattern of chip carriers which may be easily tested, inspected, burned-in, and repaired.

Still another object of this invention is to provide a chip deployment scheme which minimizes chip-to-chip input/output requirements.

It is a further object of this invention to provide a technique for coupling integrated circuits that inherently protects wirebonds from physical damage by placing these limited wirebonds in sheltered areas.

Yet another object of the invention claimed below is to provide apparatus for microelectronic interconnection which avoids the deleterious additional capacitance and inductance that are introduced by prior devices which incorporates many long wire connectors within integrated circuit assemblies.

It is also an object of the present invention to cut down the mass of integrated circuit systems in order to fabricate systems which can be economically placed in an orbital environment.

An appreciation of other aims and objects of the present invention and a more complete and comprehensive understanding of the this invention may be achieved by studying the following description of a preferred embodiment and by referring to the accompanying drawings.

DESCRIPTION OF A PREFERRED EMBODIMENT

Figure 1:
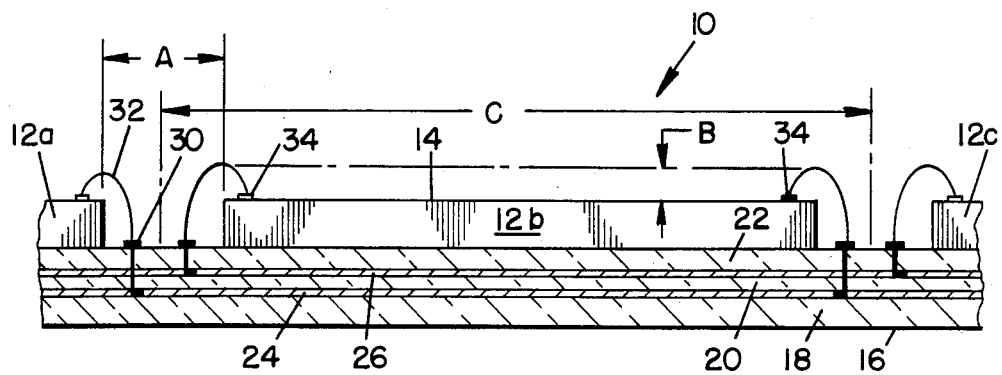
FIG. 1 is cross-sectional view of a typical prior semiconductor packaging design which incorporates undesirable, unreliable, and wasteful lengthy wirebonds between adjacent chips. This drawing depicts a semiconductor chip or die flanked by two other chips which are interconnected by long looped wires. The wires are also bonded to an interconnection device below the chips.

FIG. 1 illustrates a prior design that incorporates undesirable wirebonds. A conventional chip assembly 10 includes semiconductor chips 12a,b,c each having an active circuitry surface 14. Each chip or die 12 resides atop an interconnection device 16 comprising alternate dielectric 18, 20, 22 and conductive layers 24, 26 for connecting the chip assembly 10 to external interface terminals (not shown). Metal posts 28 extend the horizontal conductive layers or planes 24, 26 upward to conventional wirebond pads 30. Thermocompression bonding techniques are employed to connect lengthy, looped wires 32 to the pads 30 arranged on the top surface of interconnection device 16. The long, looped wires 32 are coupled to the chips 12a,b,c at chip bond pads 34.

Figure 2:
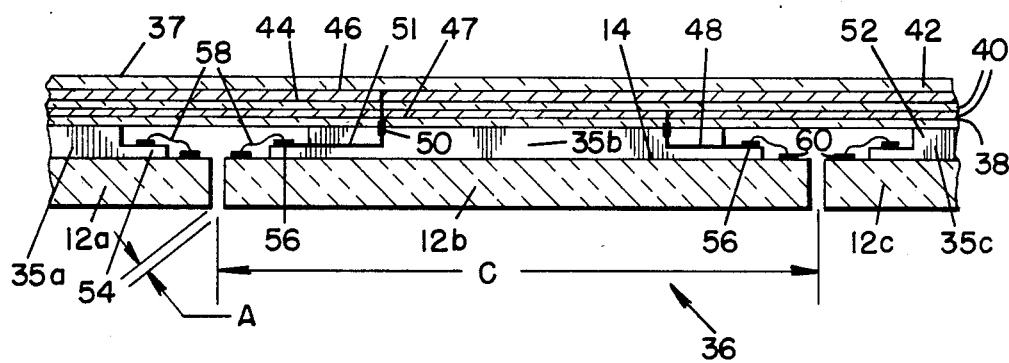
FIG. 2 is a cross-sectional view of the present invention. A central chip is shown flanked by two other chips, just as illustrated in FIG. 1. The Patraw Inverted Chip Carrier, however, deploys the chips below their respective carriers, which are each mated to an interconnection device that lies above both the carriers and the chips.

FIG. 2 reveals the tremendous advantages which are realized when the configuration of the present invention is adopted to provide interconnections for the same three chips 12a,b,c. The new enhanced chip assembly 36 that implements the function and benefits of Patraw Inverted Chip Carrier 35 comprises a novel carrier 35a,b,c sandwiched between an improved, modified interconnection device 37 and the same three chips 12a,b,c as shown in FIG. 1. Each chip 12a,b,c is held in place below its carrier 35a,b,c. The boundary between each chip 12a,b,c and its carrier 35a,b,c is a plane containing the uppermost layer of the active circuitry 14 of each die. The modified interconnection device 37 is similar to the conventional interconnection device 16 as shown in FIG. 1, in that the interconnection device 37 used in the present invention comprises alternating dielectric 38, 40, 42 and conductive 44, 46 layers. In the preferred embodiment, the dielectric layers are fabricated from ceramic, silicon dioxide, sapphire, or polyimide material separated by two or more metallization layers.

The primary difference in the interconnection device 16 used in the prior design and that employed in the invention claimed below is that internal conductors 47 in the preferred embodiment of the present invention couple the horizontal layers 44, 46 to a plurality of connectors 48 embedded or otherwise mechanically attached to the lower surface of interconnection device 37 which faces both the carriers 35a,b,c and the chips 12a,b,c. These connectors 48 may be conductive aluminum pads which are ultrasonically bonded to a thin film polyimide decal. They may, alternatively, be compression bonded indium-gold dots or thermally reflowed solder bumps. The connectors 48 may also be conventional pin and socket arrangements.

In any event, the connector array 48 on the lower surface of interconnection device 37 is arranged in registry with a corresponding, compatible array of connectors 50 atop each mesa portion 52 of each chip 12a,b,c. Each of the corresponding connectors 50 residing upon the uppermost surface of each carrier 35a,b,c is linked to internal carrier conductors 51 which are, in turn, electrically coupled to conductive terminals 56 arranged on ledge surfaces 54. Electrical signals are conveyed to and from each chip 12a,b,c through ledge terminals 56 to conductive pads 60 (same as 34 in FIG. 1) by short, relatively straight wire connectors 58.

Figure 3:
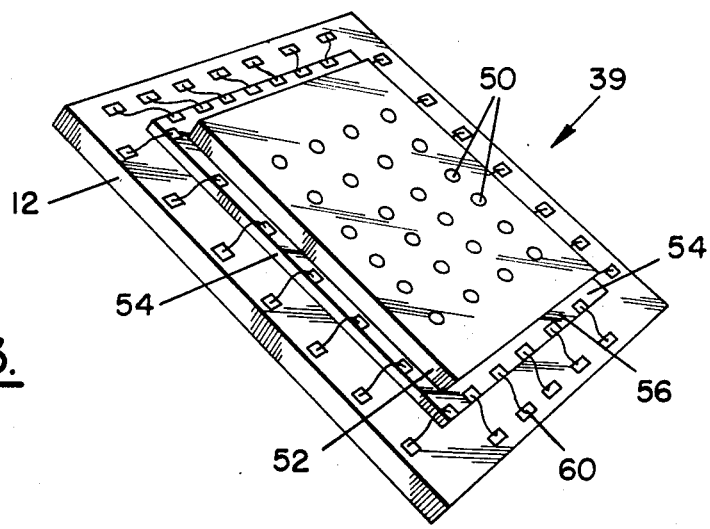
FIG. 3 is a perspective, elevational view of the present invention revealing an array of conductive connectors atop the mesa portion of the carrier which sits atop a pedestal or base that includes four surrounding ledge surfaces. The bottom of the carrier is shown coupled to a single semiconductor chip electrically coupled to the carrier by short connecting wires.

FIG. 3 shows the carrier 35 and chip 12 together in a sub-assembly 39 in a perspective view before it is attached to interconnection device 37.

FIG. 1 depicts a measured, horizontal inter-chip spacing labeled A. Assuming conventional die dimensions of 300 by 240 by 25 mils which are typical for current VLSI systems, this inter-chip or die interspacing distance A, is a minimum of four times the die height and is usually exceeds 100 mils in prior, conventional packaging arrays such as the example shown in FIG. 1. This large gap is required in order to accomodate the wirebound tool (not shown) which must connect the long, looped lengths of wire 32 to their respective pads 30, 34. In FIG. 2, the inter-chip spacing A between adjacent chips has been dramatically reduced to only about 4 to 10 mils. This improvement provides a reduction in wasted space which is over one full order of magnitude in scale.

The additional space wasted by the looped wires is marked by dimension B in FIG. 1. This expensive and needless use of orthogonal space, i.e., additional volume which extends perpendicular to the plane of the active circuitry 14 of each chip 12a,b,c; is totally avoided by the present invention, as illustrated in FIG. 2. In FIG. 1, the wasted orthogonal space is conservatively estimated to be approximately 15 mils.

The effective, over-all dimensions required by each chip 12a,b,c in the prior designs would be 400 by 340 by 50 mils for a die measuring 300 by 240 by 25 mils. The effective planar space required for a single chip by the prior design and the present invention are indicated by dimension C in both FIGS. 1 and 2. The planar space or horizontal area consumed by the prior design shown in FIG. 1 is 90% greater than the planar area taken up by the present invention incorporating the same chip. The prior design requires 90% more volume than the volume required by the configuration which implements the Patraw design. The Patraw Inverted Chip Carrier enables a designer ordinarily skilled in the art to take a current, commercially available chip, place that chip in this new carrier, and realize an enormous increase in volume available for active circuitry of 65% for only a tiny 3% increase in planar area compared to the bare die dimensions.

Although the present invention has been described in detail with reference to a particular preferred embodiment, persons possessing ordinary skill in the art to which this invention pertains will appreciate that various modifications and enhancements may be made without departing from the spirit and scope of the invention.

What is claimed is:

1. A microelectronic chip interface apparatus for electrically coupling to circuit interface means provided upon a microelectronic chip, said apparatus comprising:
   a mesa portion having a plurality of mesa interface means, said mesa portion being mounted upon a top surface of the chip,
   at least one ledge portion extending outwardly from said mesa portion, said ledge portion having a plurality of ledge interface means,
   said ledge interface means being electrically coupled to a plurality of coupling wires, each of said wires further being coupled to a corresponding circuit interface means,
   a plurality of carrier internal conductors, said carrier internal conductors being selectively electrically coupled to said plurality of mesa interface means, and
   said carrier internal conductors also being selectively electrically coupled to said plurality of ledge interface means whereby each of said circuit interface means is electrically coupled to one of said mesa interface means.

2. Apparatus as claimed in claim 1 in which said mesa interface means is a plurality of conductive bond pads.

3. Apparatus as claimed in claim 1 in which said mesa interface means is a plurality of metal pin connectors.

4. Apparatus as claimed in claim 1 in which said mesa interface means is a plurality of compression bonded conductive dots.

5. Apparatus as claimed in claim 4 in which said plurality of compression bonded conductive dots are made of a thermally reflowable eutectic material.

6. Apparatus as claimed in claim 1 in which said ledge interface means is a plurality of conductive bond pads.

7. Apparatus as claimed in claim 1 in which said plurality of carrier internal conductors includes a plurality of vertical carrier internal conductors electrically and mechanically coupled to a plurality of horizontal carrier internal conductors.

8. Apparatus for providing a microelectronic interconnection assembly comprising:
   a semiconductor chip having chip interface means and having an active circuitry surface;
   a carrier means including:
   a mesa portion having a plurality of mesa interface means upon a top surface, said mesa portion being mounted upon said active circuitry surface along a bottom mesa surface,
   at least one ledge portion having a plurality of ledge interface means, said ledge portion extending outwardly from said mesa portion along said active circuitry surface,
   said ledge interface means being electrically coupled to said chip interface means with a plurality of chip-ledge coupling means,
   a plurality of carrier internal conductors, said carrier internal conductors being selectively electrically coupled to said plurality of mesa interface means, and
   said carrier internal conductors also being selectively electrically coupled to said plurality of ledge interface means; and
   a hypercarrier interconnection means including:
   a plurality of alternating hypercarrier dielectric and conductive layers,
   hypercarrier interface means in registry with and disposed to receive and to be electrically coupled to said mesa interface means;
   said conductive layers being selectively electrically coupled to a plurality of output terminals,
   said conductive layers also being selectively electrically coupled to a plurality of internal, vertical hypercarrier conductors which are selectively electrically coupled to said hypercarrier interface means.

9. Apparatus as claimed in claim 8 in which said chip interface means is a plurality of conductive input/output pads around the periphery of said active circuit surface of said chip.

10. Apparatus as claimed in claim 8 in which said mesa interface means is a plurality of conductive bond pads suitable for coupling to said chip-ledge coupling means.

11. Apparatus as claimed in claim 8 in which said mesa interface means is a plurality of metal pin connectors.

12. Apparatus as claimed in claim 8 in which said mesa interface means is a plurality of compression bonded conductive dots.

13. Apparatus as claimed in claim 12 in which said compressin bonded conductive dots are made of an indium-gold alloy.

14. Apparatus as claimed in claim 8 in which said ledge interface means is a plurality of bond pads suitable for connection to said chip-ledge coupling means.

15. Apparatus as claimed in claim 8 in which said chip-ledge coupling means is a plurality of bond wires.

16. Apparatus as claimed in claim 8 in which said plurality of carrier internal conductors includes a plurality of vertical carrier internal conductors electrically and mechanically coupled to a plurality of horizontal carrier internal conductors.

17. Apparatus as claimed in claim 8 in which said hypercarrier conductive layers are etched metal films.

18. Apparatus as claimed in claim 8 in which said hypercarrier dielectric layers are epoxied ceramic slabs.

19. Apparatus as claimed in claim 8 in which said plurality of hypercarrier interface means is a plurality of conductive pads.

20. Apparatus as claimed in claim 8 in which said plurality of hypercarrier interface means is a plurality of metal pin connectors.

21. Apparatus as claimed in claim 8 in which said plurality of hypercarrier interface means is a plurality of compression bonded conductive dots.

22. Apparatus as claimed in claim 21 in which said said compression bonded conductive dots are made of an indium-gold alloy.

* * * * *